(12) United States Patent
Shin et al.

(10) Patent No.: US 7,595,795 B2
(45) Date of Patent: Sep. 29, 2009

(54) PHOTOSENSOR AND DISPLAY DEVICE INCLUDING PHOTOSENSOR

(75) Inventors: Kyong-Ju Shin, Yongin-si (KR);
Jin-Hong Kim, Seoul (KR);
Seung-Hwan Moon, Yongin-si (KR);
Chong-Chul Chae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 718 days.

(21) Appl. No.: 11/096,742

(22) Filed: Apr. 1, 2005

(65) Prior Publication Data
US 2005/0218302 A1    Oct. 6, 2005

(30) Foreign Application Priority Data
Apr. 1, 2004    (KR) .................... 10-2004-0022558

(51) Int. Cl.
*G09G 5/00* (2006.01)
(52) U.S. Cl. ..................................... 345/207
(58) Field of Classification Search ................ 345/207, 345/204–206, 690
See application file for complete search history.

(56) References Cited

U.S. PATENT DOCUMENTS 4,660,180 A * 4/1987 Tanimura et al. ............ 365/222
5,469,296 A * 11/1995 Ohno et al. .................. 359/603
6,297,791 B1   10/2001 Naito
6,351,283 B1 * 2/2002 Liu .............................. 348/301
6,396,217 B1 * 5/2002 Weindorf .................. 315/169.1
7,057,593 B2   6/2006 Cho
2001/0035848 A1   11/2001 Johnson

FOREIGN PATENT DOCUMENTS

| JP | 09146073 | 6/1997 |
|----|----------|--------|
| JP | 11316577 | 11/1999 |
| JP | 2003009040 | 10/2003 |
| KR | 1020030092552 | 6/2003 |

* cited by examiner

*Primary Examiner*—Richard Hjerpe
*Assistant Examiner*—Leonid Shapiro
(74) *Attorney, Agent, or Firm*—Cantor Colburn LLP

(57) ABSTRACT

A photosensor is provided, which includes a sensor, a reference voltage generator and a processor. The sensor receives an external light and generates a sensing voltage in response to an amount of the external light received. The reference voltage generator is blocked from the external light and generates a reference voltage. The processor receives the sensing voltage from the sensor and the reference voltage from the reference voltage generator to generate a sensor output voltage in response to a difference between the sensing voltage and the reference voltage.

24 Claims, 12 Drawing Sheets

| $V_{out}$ | SEL1 | SEL2 | $V_{con}$ |
|---|---|---|---|
| $0 < V_{out} \leq a$ | 0 | 0 | $V_4$ |
| $a < V_{out} \leq b$ | 0 | 1 | $V_3$ |
| $b < V_{out} \leq c$ | 1 | 0 | $V_2$ |
| $c < V_{out}$ | 1 | 1 | $V_1$ |

( $a < b < c$ , $V_1 < V_2 < V_3 < V_4$ )

PHOTOSENSOR AND DISPLAY DEVICE INCLUDING PHOTOSENSOR

The present application claims priority from Korean Patent Application No. 2004-0022558, filed on Apr. 1, 2004, the disclosure of which is hereby incorporated herein by reference in its entirety.

BACKGROUND (a) Technical Field

The present invention relates to a photosensor and, more particularly, to a display device including a photosensor.

(b) Disclosure of Related Art

Examples of flat panel displays include a liquid crystal display (LCD), an organic light emitting display (OLED), and a plasma display panel (PDP). The LCD devices are the most widely used flat panel display, which include two panels and a liquid crystal layer having dielectric anisotropy disposed between the two panels. In an LCD device, an electric field is applied to the liquid crystal layer and the electric field is controlled to adjust transmittance of light passing through the liquid crystal layer, thereby displaying images.

Since the LCD devices are not a self-emissive display device, they include a backlight unit for supplying light to the two panels. However, the backlight unit consumes a significant amount of power, and thus it is suggested that a photosensor be employed to control the backlight unit. The photosensor is particularly suited for use in portable devices such as mobile phones and notebook computers.

Additionally, the LCD usually includes thin film transistors (TFTs) containing amorphous silicon and an amorphous silicon TFT generates photocurrent when exposed to light. Accordingly, the amorphous silicon TFT can be used as a photosensor since the photocurrent generated by the amorphous silicon TFT is responsive to an amount of light to which the amorphous silicon TFT is exposed.

However, for mass-production of the LCD and other display devices employing photosensors, the photocurrents generated by TFTs have wide ranges due to manufacturing process variations. In addition, heat emitted by the backlight unit may change characteristics of the TFTs and thereby change the photocurrents. Additionally, long-term driving of the LCD and other display devices may change the characteristics of the TFTs to vary the photocurrent.

In such cases, a sensitivity variation of the photosensor is generated and thus an additional process for removing the sensitivity variation is required. As a result, reliability of the photosensor is decreased and cost is increased.

SUMMARY OF THE INVENTION

An object of the present invention is to provide a photosensor and a display device having the same able to solve such conventional problems.

A photosensor is provided, which includes a sensor, a reference voltage generator, and a processor. The sensor receives an external light and generates a sensing voltage in response to an amount of the external light received. The reference voltage generator is blocked from the external light and generates a reference voltage. The processor receives the sensing voltage from the sensor and the reference voltage from the reference voltage generator to generate a sensor output voltage in response to a difference between the sensing voltage and the reference voltage.

The sensor may include a first light receiver generating a first photovoltage in response to the amount of the external light received and a first output unit converting the first photovoltage into the sensing voltage The reference voltage generator may include a second light receiver generating a second photovoltage and a second output unit converting the second photovoltage into the reference voltage.

The first light receiver may include a first sensor transistor exposed to the external light and generating a photocurrent in response to the amount of the external light received and a first capacitor storing charges in response to the photocurrent to generate the first photovoltage.

The second light receiver may include a second sensor transistor generating a reference current and a second capacitor storing charges in response to the reference current to generate the second photovoltage.

In this case, the photosensor may further include a light blocking member blocking the second sensor transistor from the external light.

The first sensor transistor may include an input terminal receiving a first voltage, a control terminal receptive of an off voltage for turning off the first sensor transistor, an output terminal outputting the photocurrent, and a first photosensitive layer connected between the input terminal and the output terminal and generating the photocurrent.

The second sensor transistor may include an input terminal receiving the first voltage, a control terminal receptive of the off voltage, an output terminal outputting the reference current, and a second photosensitive layer generating the reference current.

The first and second photosensitive layers are preferably made of the same material. The material may be amorphous silicon.

The first capacitor may include a first terminal connected to the output terminal of the first sensor transistor and with a second terminal receiving a second voltage, and the second capacitor may include a first terminal connected to the output terminal of the second sensor transistor and with a second terminal receiving the second voltage.

The first output unit may include a first switching transistor selectively outputting the first photovoltage responsive to a switching signal, and the second output unit may include a second switching transistor selectively outputting the second photovoltage responsive to the switching signal.

The first switching transistor may include a control terminal receptive of the switching signal, an input terminal receiving the first photovoltage, and an output terminal selectively outputting the first photovoltage responsive to the switching signal.

The second switching transistor may include a control terminal receptive of the switching signal, an input terminal receiving the second photovoltage, and an output terminal selectively outputting the second photovoltage responsive to the switching signal.

The first output unit may further include a first output capacitor converting an output of the first switching transistor into the sensing voltage, and the second output unit may further include a second output capacitor converting an output of the second switching transistor into the reference voltage.

The first output capacitor may include a first terminal connected to the output terminal of the first switching transistor and a second terminal connected to a second voltage, and the second output capacitor may include a first terminal connected to the output terminal of the second transistor and a second terminal connected to the second voltage.

The sensor may further include a first reset transistor initializing the first photovoltage in response to a reset signal, and the reference voltage generator may further include a second reset transistor initializing the second photovoltage in response to the reset signal.

A display device is provided, which includes a photosensor receiving an external light to generate a sensor output voltage corresponding to an amount of the external light received, a voltage converter converting the sensor output voltage into a control voltage, a panel assembly including pixels and a lighting unit having a luminance provided to the pixels responsive to the control voltage The photosensor may include a sensor generating a sensing voltage corresponding to the amount of the external light received, a reference voltage generator blocked from the external light and generating a reference voltage, and a processor generating the sensor output voltage which is a difference between the sensing voltage and the reference voltage.

The display device may be one of a liquid crystal display, an organic electroluminescent display and a plasma display panel.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

The present invention will be described more fully hereinafter with reference to the accompanying drawings, in which exemplary embodiments of the invention are shown.

Figure 1:
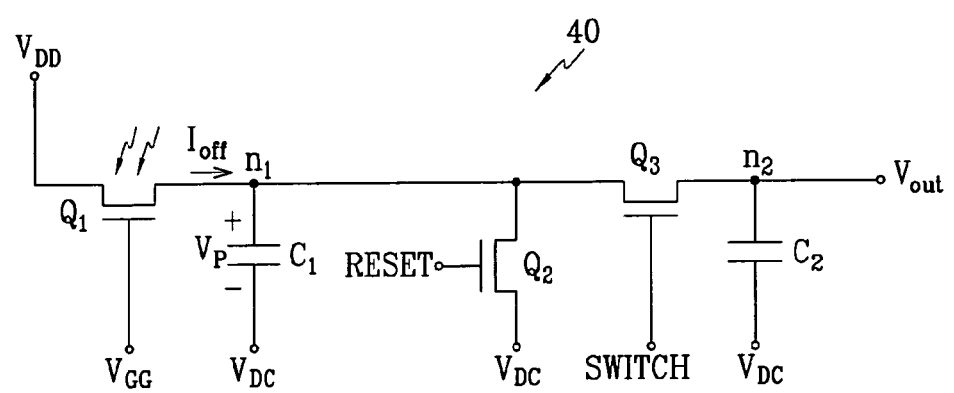
FIG. 1 is an equivalent circuit diagram of a photosensor according to an exemplary embodiment of the present invention.

First, a photosensor according to an embodiment of the present invention will be described in detail with reference to FIG. 1. FIG. 1 is an equivalent circuit diagram of a photosensor according to an exemplary embodiment of the present invention.

As shown in FIG. 1, a photosensor 40 according to this exemplary embodiment of the present invention includes three thin film transistors (TFTs) and two capacitors C1 and C2. The three TFTs include a sensor transistor Q1, a reset transistor Q2 and a switching transistor Q3. The photosensor 40 generates a sensor output voltage $V_{out}$ having a magnitude that varies in response to an amount of external light received.

The sensor transistor Q1 has a drain supplied with a first voltage $V_{DD}$, a gate supplied with a second voltage $V_{GG}$, and a source. The reset transistor Q2 has a drain supplied with a third voltage $V_{DC}$, a gate supplied with a reset signal RESET and a source. The switching transistor Q3 has a gate supplied with a switching signal SWITCH and a source and a drain.

Reference numerals n1 and n2 denote nodes between the source of the sensor transistor Q1 and the source of the reset transistor Q2 and between the source of the switching transistor Q3 and the output terminal of the photosensor 40, respectively.

The capacitor C1 has first terminal connected to the node n1 and a second terminal connected to the third voltage $V_{DC}$ and the capacitor C2 has first terminal connected to the node n2 and a second terminal connected to the third voltage $V_{DC}$.

The first voltage $V_{DD}$ applied to the sensor transistor Q1 may be a gate on voltage Von for turning on transistors, and the second voltage $V_{GG}$ may be a gate off voltage Voff for turning off transistors and the third voltage $V_{DC}$ may be a ground voltage. However, the voltages $V_{DD}$, $V_{GG}$ and $V_{DC}$ may be different therefrom.

Now, the operation of the photosensor 40 generating the sensor output voltage $V_{out}$ that varies in response to the amount of external light received will be described.

Upon receipt of external light, the sensor transistor Q1 generates a photocurrent Ioff in response to the amount of the external light received. However, a light blocking film (not shown) for blocking external light is provided on the reset transistor Q2 and the switching transistor Q3, which generate no photocurrent.

The photocurrent Ioff flows into the capacitor C1 and a charge is stored therein. The charge stored in the capacitor C1 generates a photovoltage Vp across the capacitor C1. The photovoltage Vp varies in response to the photocurrent Ioff and thus varies in response to the amount of external light received.

The reset transistor Q2 is turned on/off in response to the reset signal RESET that is supplied from an external device such as a display device employing the photosensor 40. The reset signal RESET may have a period of one frame or several frames.

For example, when the reset signal RESET is at a high level, the reset transistor Q2 turns on, and thereby the charge stored in the capacitor C1 is discharged via the reset transistor Q2. When the reset signal RESET is at a low level, the reset transistor Q2 turns off to stop a discharge of the capacitor C1. Accordingly, the sensor transistor Q1 generates the photocurrent Ioff again and the storage capacitor C1 begins storing electric charges to generate the photovoltage Vp that varies in response to the amount of external light received.

The switching transistor Q3 is turned on/off in response to the switching signal SWITCH that may also be supplied from an external device such as a display device employing the photosensor 40, and has the same period as the reset signal RESET.

For example, when the switching signal SWITCH is at a high level to turn on the switching transistor Q3, the photovoltage Vp stored in the capacitor C1 is outputted to the node n2 and the capacitor C2 is charged with a same voltage as the photovoltage Vp. When the switching signal SWITCH is at a low level to turn off the switching transistor Q3, the sensor output voltage $V_{out}$ is constant.

A photosensor according to another exemplary embodiment of the present invention will now be described with reference to FIGS. 2 and 3.

Figure 2:
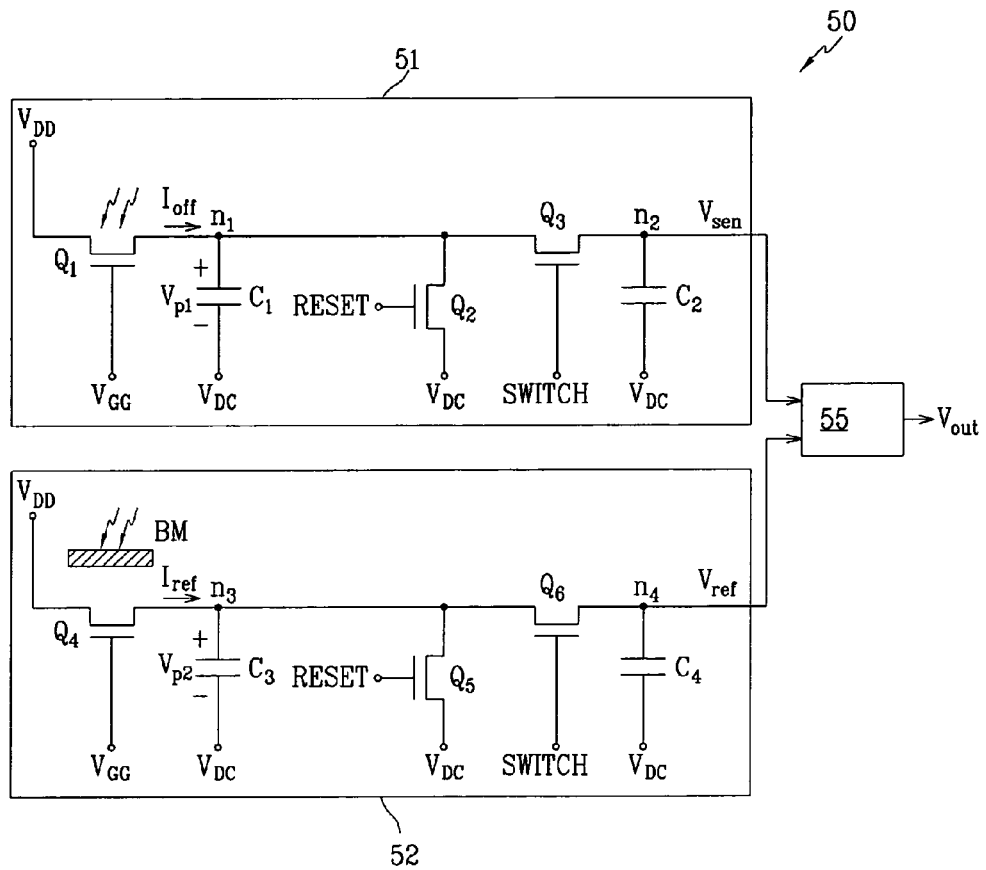
FIG. 2 is an equivalent circuit diagram of a photosensor according to another exemplary embodiment of the present invention.
Figure 3:
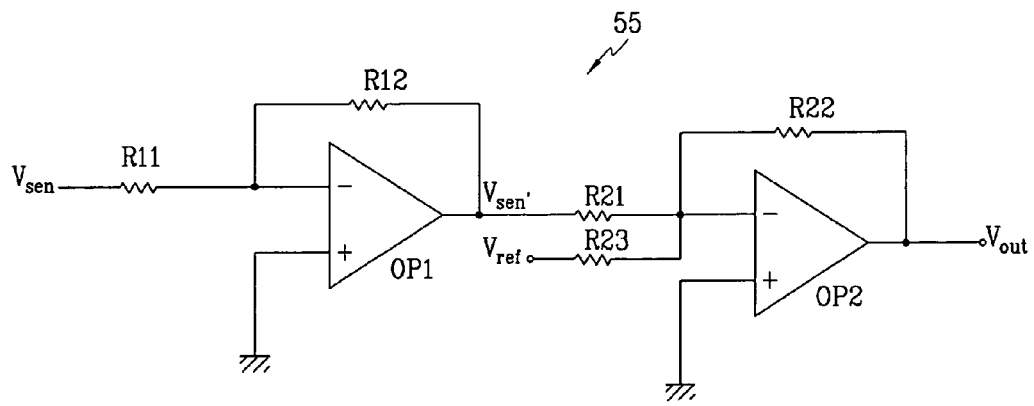
FIG. 3 is an exemplary circuit diagram of a processor of the photosensor in FIG. 2.

FIG. 2 is an equivalent circuit diagram of a photosensor according to another exemplary embodiment of present invention, and FIG. 3 is an exemplary circuit diagram of a processor of the photosensor shown in FIG. 2.

Referring to FIG. 2, a photosensor 50 according to another embodiment of the present invention includes a sensor 51, a reference voltage generator 52 and a processor 55. The sensor 51 includes a sensor transistor Q1, a reset transistor Q2, a switching transistor Q3 and two capacitors C1 and C2. The reference voltage generator 52 induces a sensor transistor Q4, a reset transistor Q5, a switching transistor Q6 and two capacitors C3 and C4.

The sensor 51 and the reference voltage generator 52 each have substantially the same structure as the photosensor 40 shown in FIG. 1. In particular, the sensor transistor Q1 of the sensor 51 and the sensor transistor Q4 of the reference voltage generator 52 have substantially the same characteristics as the sensor transistor Q1 of the photosensor 40 in FIG. 1. However, a light blocking film (BM) is provided on the sensor transistor Q4. A function of elements Q5, Q6, n3, n4, C3 and C4 is same as described above for elements Q2, Q3, n1, n2, C1 and C2, respectively. Additionally, a first photovoltage $V_{p1}$ and a second photovoltage $V_{p2}$ of FIG. 2, each correspond to the photovoltage Vp in FIG. 1.

The sensor 51 outputs a sensing signal $V_{sen}$ in response to an amount of external light received, and the reference voltage generator 52 outputs a reference voltage $V_{ref}$.

The sensor transistor Q4 of the reference voltage generator 52 generates a reference current Iref independent of external light and the reference voltage generator 52 generates the reference voltage $V_{ref}$ responsive to the reference current Iref. When the sensor transistor Q1 of the sensor 51 is blocked from external light, the sensor transistor generates a photocurrent Ioff that is substantially same as the reference current $I_{ref}$.

The processor 55 is supplied with the sensing voltage $V_{sen}$ and the reference voltage $V_{ref}$ to generate the sensor output voltage $V_{out}$ corresponding to a difference between the sensing voltage $V_{sen}$ and the reference voltage $V_{ref}$.

As shown in FIG. 3, the processor 55 includes a first operational amplifier OP1 and a second operational amplifier OP2 electrically connected sequentially. Resistors R11, R12, R21, R22 and R23 each have a same resistance value. The operational amplifier OP1 is an inverter having an inverting terminal receiving the sensing voltage $V_{sen}$ via the resistor R11 and a non-inverting terminal receiving a ground voltage. The operational amplifier OP1 includes an output terminal electrically connected to the inverting terminal of the operational amplifier OP1 via the resistor R12. The operational amplifier OP1 inverts the sensing voltage $V_{sen}$ to output an inverted voltage $V_{sen}'$. The operational amplifier OP2 is an inverting adder which has an inverting terminal receiving the inverted voltage $V_{sen}'$ via the resistor R21 and the reference voltage $V_{ref}$ via the resistor R23. The non-inverting terminal of the operational amplifier OP2 receives a ground voltage and an output terminal of the operational amplifier OP2 is electrically connected to the inverting terminal of the operational amplifier OP2 via the resistor R22. The operational amplifier OP2 adds the inverted voltage $V_{sen}'$ to the reference voltage $V_{ref}$ and then inverts a resultant voltage to generate the sensor output voltage $V_{out}$.

The sensor output voltage $V_{out}$ of the operational amplifier OP2 is calculated as follows:

$$V_{out} = V_{sen} - V_{ref} \tag{1}$$

Figure 4A:
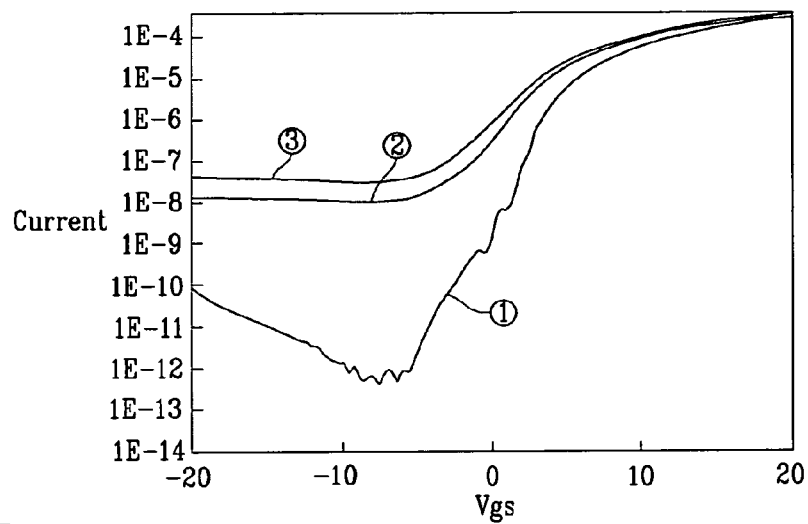
FIG. 4A is a graph to illustrate a voltage-current characteristic according to amount of an external light of a sensor transistor in a sensor.
Figure 4B:
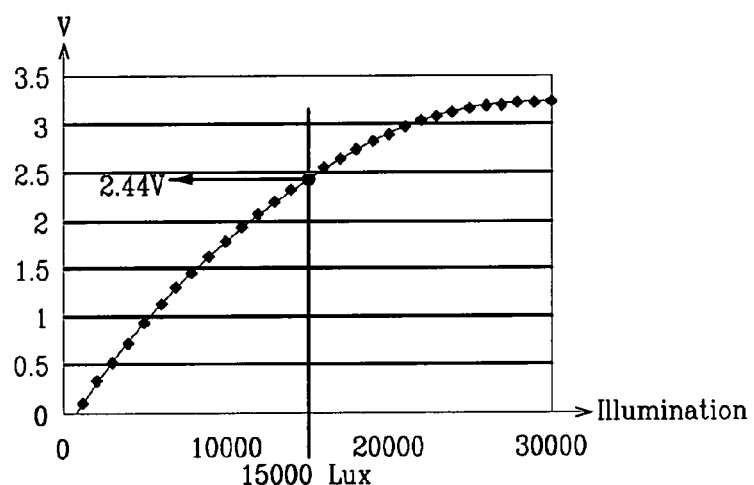
FIGS. 4B and 4C are graphs to illustrate output voltages of a sensor according to an amount of external light in an initial state and in a characteristic-varied state, respectively.
Figure 4C:
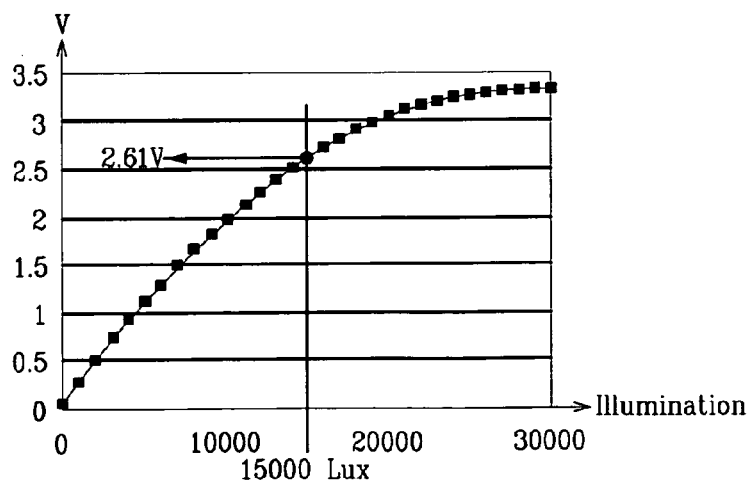

FIG. 4A is a graph to illustrate a voltage $V_{gs}$—current $I_{off}$ characteristic according to the amount of external light received by the sensor transistor Q1 in the sensor 51, and FIGS. 4B and 4C are graphs to illustrate sensing voltages $V_{sen}$ of the sensor 51 according to the amount of external light received in an initial state and in a characteristic-varied state, respectively.

Curve 1 in FIG. 4A represents a voltage-current characteristic in blocking light, and curve 2 represents a voltage-current characteristic in the initial state in response to an external illumination of 15,000 Lux and curve 3 represents a voltage-current characteristic in the characteristic-varied state of the sensor transistor Q1 with external illumination of 15,000 Lux. FIG. 4B shows the sensing voltage $V_{sen}$ corresponding to the curve 2 and FIG. 4C shows the sensing voltage $V_{sen}$ corresponding to the curve 3. The sensing voltage $V_{sen}$ corresponding to the illumination of 15,000 Lux is 2.44V in FIG. 4B and 2.61V in FIG. 4C. Thus, variation of a characteristic of the sensor transistor Q1 causes the sensing voltage $V_{sen}$ to be varied even though the external illumination is constant.

However, the photosensor 50 according to this embodiment of the present invention obtains a selected constant sensor output voltage $V_{out}$ corresponding to the amount of received external light even though the characteristic of the sensor transistor Q1 is varied, as will be described below.

The sensor transistors Q1 and Q4 are disposed adjacent to each other. In addition, photosensitive layers (not shown) of each of the sensor transistors Q1 and Q4 contains amorphous silicon, and each of the sensor transistors Q1 and Q4 is assumed to have same characteristics due to production of each of the sensor transistors Q1 and Q4 using substantially same procedures. Therefore, when a certain condition causes a characteristic of the sensor transistor Q1 to vary, the same characteristic of the sensor transistor Q4 is varied in substantially a same manner. Thus an amount of variation of the photocurrent $I_{off}$ of the sensor transistor Q1 and an amount of variation of the reference current $I_{ref}$ become substantially identical. As a result, even though the characteristic of the sensor transistor Q1 is varied to cause a variation in the photocurrent $I_{off}$, the same amount of variation of the reference current $I_{ref}$ causes no change in the sensor output voltage $V_{out}$. Thus the photosensor 50 generates a constant sensor output voltage $V_{out}$ for the same amount of received external light despite variation of a characteristic of the sensor transistor Q1.

Now, an LCD including a photosensor according to an embodiment of the present invention will be described in detail with reference to FIGS. 5-7.

Figure 5:
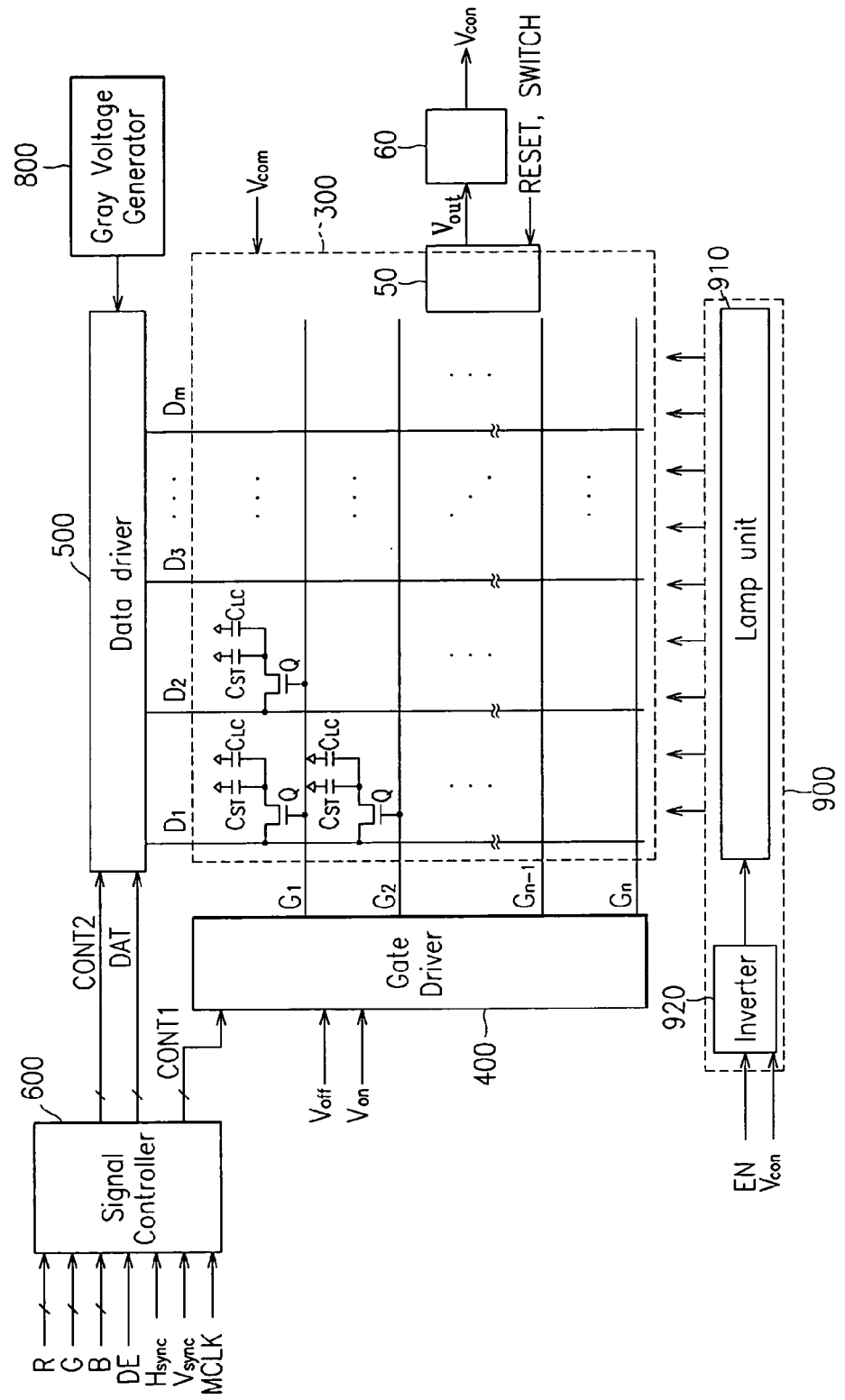
FIG. 5 is a block diagram of an LCD according to an exemplary embodiment of the present invention.
Figure 6:
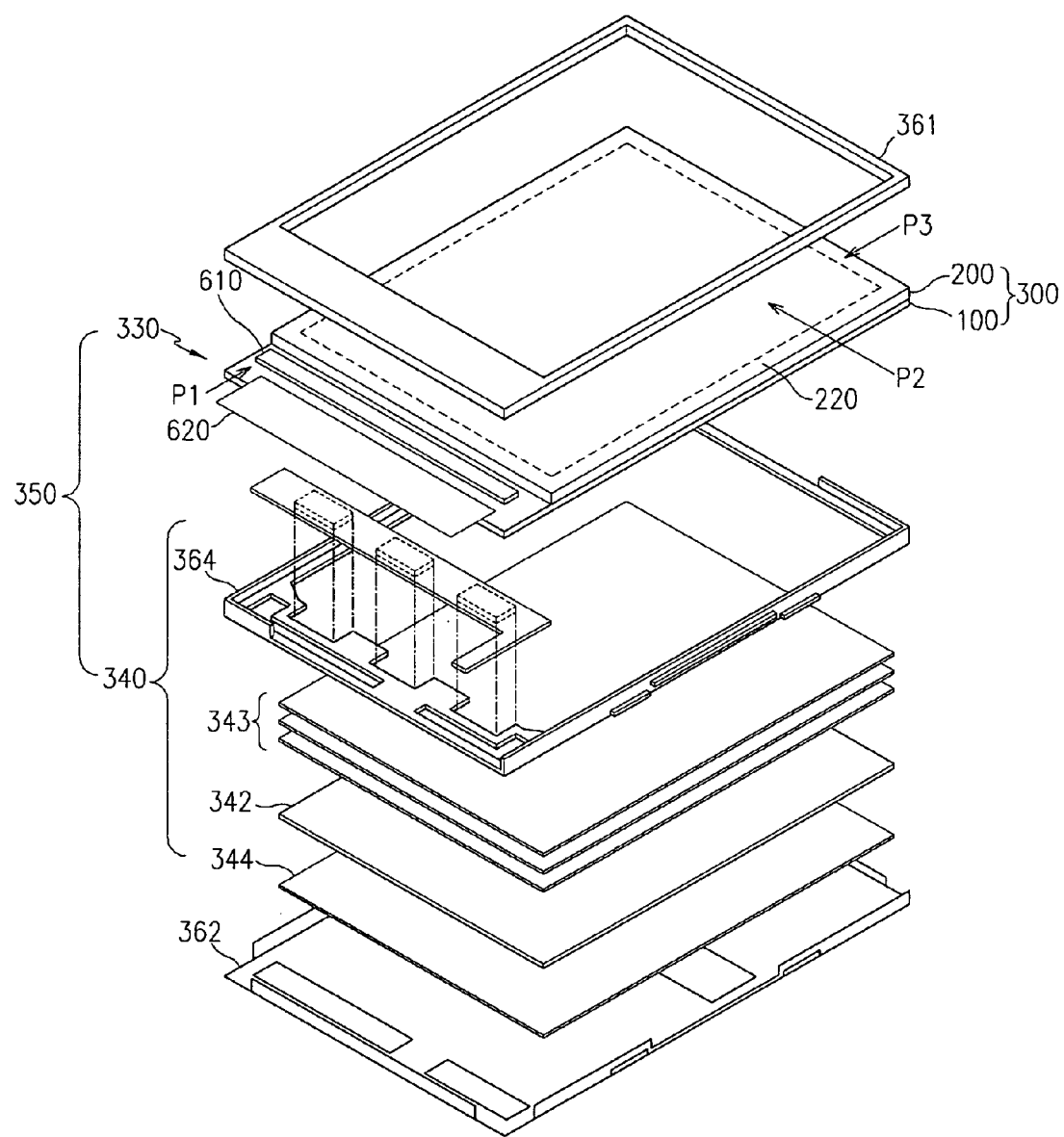
FIG. 6 is an exploded perspective view of an LCD according to an exemplary embodiment of the present invention.
Figure 7:
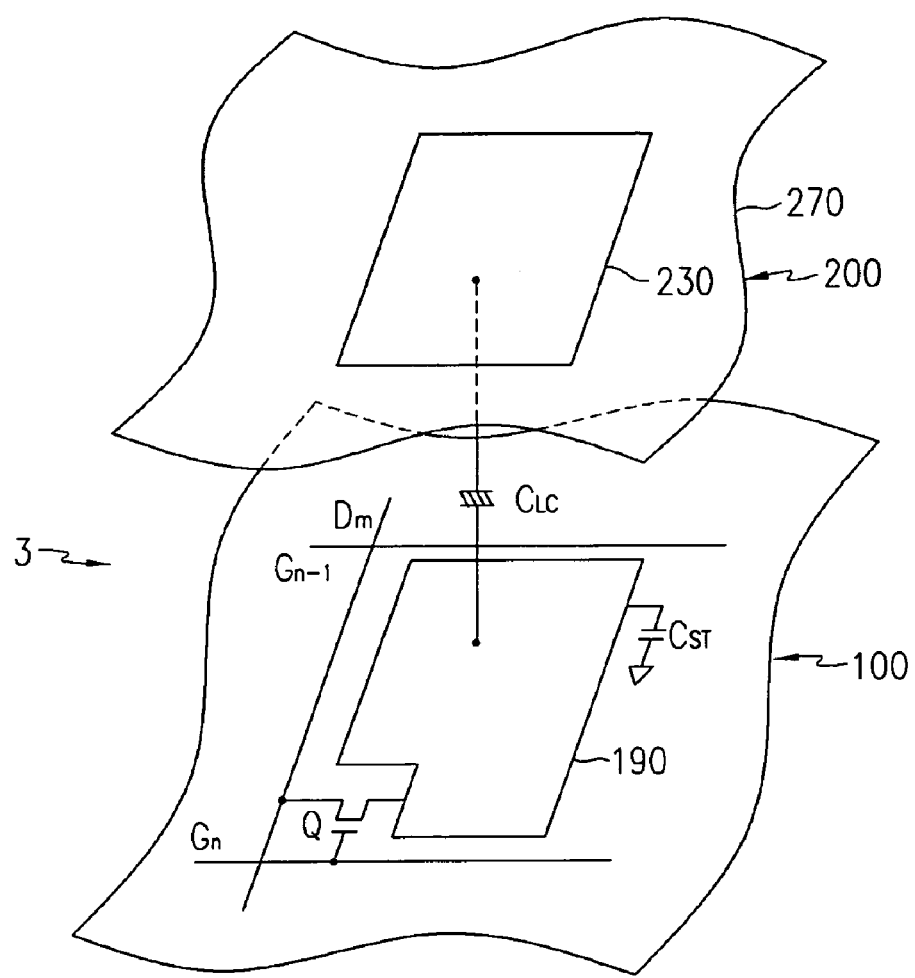
FIG. 7 is an exemplary equivalent circuit diagram of the LCD shown in FIGS. 5 and 6.

FIG. 5 is a block diagram of an LCD according to an exemplary embodiment of the present invention, FIG. 6 is an exploded perspective view of an LCD according to an exemplary embodiment of the present invention, and FIG. 7 is an exemplary equivalent circuit diagram of the LCD shown in FIGS. 5 and 6.

Referring to FIG. 5, an LCD according to an exemplary embodiment of the present invention includes a photosensor 50 disposed on a panel assembly 300, a voltage converter 60 electrically connected to the photosensor 50, a gate driver 400 and a data driver 500 electrically connected to the display panel assembly 300, a gray voltage generator 800 electrically connected to the data driver 500, a lighting unit 900 for illuminating the panel assembly 300, and a signal controller 600 controlling the above-described elements.

The panel assembly 300 includes a lower panel 100, an upper panel 200, and a liquid crystal (LC) layer 3 interposed therebetween as shown in FIG. 7. In a circuital view, the display panel assembly 300 includes a plurality of display signal lines $G_1$-$G_n$ and $D_1$-$D_m$ and a plurality of pixels electrically connected thereto and arranged substantially in a matrix.

The display signal lines $G_1$-$G_n$ and $D_1$-$D_m$ are disposed on the lower panel 100 and include gate lines $G_1$-$G_n$ transmitting gate signals (also referred to as "scanning signals") and data lines $D_1$-$D_m$ transmitting data signals. The gate lines $G_1$-$G_n$ extend substantially in a row direction and are substantially parallel to each other, while the data lines $D_1$-$D_m$ extend substantially in a column direction and are substantially parallel to each other.

Each pixel includes a switching element Q electrically connected to the display signal lines $G_1$-$G_n$ and $D_1$-$D_m$, and an LC capacitor $C_{LC}$ and a storage capacitor $C_{ST}$ that are electrically connected to the switching element Q. The storage capacitor $C_{ST}$ may be omitted if unnecessary.

The switching element Q may be implemented as a TFT that is disposed on the lower panel 100. The switching element Q has three terminals: a control terminal electrically connected to one of the gate lines $G_1$-$G_n$; an input terminal electrically connected to one of the data lines $D_1$-$D_m$; and an output terminal electrically connected to the LC capacitor $C_{LC}$ and the storage capacitor $C_{ST}$.

The LC capacitor $C_{LC}$ includes a pixel electrode 190 provided on the lower panel 100 and a common electrode 270 provided on an upper panel 200 as two conductors. The LC layer 3 disposed between the pixel and common electrodes 190 and 270 functions as a dielectric of the LC capacitor $C_{LC}$. The pixel electrode 190 is electrically connected to the switching element Q, and the common electrode 270 is supplied with a common voltage Vcom and covers an entire surface of the upper panel 200. As an alternative to the embodiment shown in FIG. 7, the common electrode 270 may be provided on the lower panel 100, and the pixel and common electrodes 190 and 270 may have shapes of bars or stripes.

The storage capacitor $C_{ST}$ is an auxiliary capacitor for the LC capacitor $C_{LC}$. The storage capacitor $C_{ST}$ includes the pixel electrode 190 and a separate signal line, which is provided on the lower panel 100 and overlaps the pixel electrode 190 via an insulator, and is supplied with a predetermined voltage such as the common voltage Vcom. Alternatively, the storage capacitor $C_{ST}$ includes the pixel electrode 190 and an adjacent gate line called a previous gate line, which overlaps the pixel electrode 190 via an insulator.

For a color display, each pixel uniquely represents one of primary colors (i.e., spatial division) or each pixel sequentially represents the primary colors in turn (i.e., temporal division) such that a spatial or temporal sum of the primary colors is recognized as a desired color. An example of a set of the primary colors includes red, green, and blue colors. FIG. 7 shows an example of the spatial division in which each pixel includes a color filter 230 representing one of the primary colors in an area of the upper panel 200 facing the pixel electrode 190. Alternatively, the color filter 230 is provided on or under the pixel electrode 190 on the lower panel 100.

One or more polarizers (not shown) are attached to at least one of the lower and upper panels 100 and 200.

Referring to FIGS. 5 and 6, the lighting unit 900 includes a lamp unit 910 and an inverter 920 electrically connected to the lamp unit 910 to provide power to the lamp unit 910. The lamp unit 910 includes lamps (not shown), a light guiding plate 342, optical sheets 343, and a reflector 344. The inverter 920 may be disposed on a stand-alone inverter PCB (not shown).

The gray voltage generator 800 generates two sets of gray voltages related to a transmittance of the pixels. The gray voltages in a first set have a positive polarity with respect to the common voltage Vcom, while the gray voltages in a second set have a negative polarity with respect to the common voltage Vcom.

The gate driver 400 is connected to the gate lines $G_1$-$G_n$ of the panel assembly 300 and synthesizes the gate-on voltage $V_{on}$ and the gate-off voltage $V_{off}$ from an external device to generate gate signals for application to the gate lines $G_1$-$G_n$.

The data driver 500 is connected to the data lines $D_1$-$D_m$ of the panel assembly 300 and applies data voltages selected from the gray voltages supplied from the gray voltage generator 800 to the data lines $D_1$-$D_m$.

According to another exemplary embodiment of the present invention, IC chips of the gate driver 400 or the data driver 500 are mounted on the lower panel 100. According to yet another exemplary embodiment, one or both of the gate and data drivers 400 and 500 are incorporated along with other elements into the lower panel 100.

The signal controller 600 controls the gate and data drivers 400 and 500, the photosensor 50, the inverter 920, etc.

Referring again to FIG. 5, the photosensor 50 receives external light and generates the sensor output voltage $V_{out}$ having a magnitude corresponding to the amount of external light received in response to a reset signal RESET and a switching signal SWITCH from the signal controller 600. The voltage converter 60 converts the sensor output voltage $V_{out}$ from the photosensor 50 into a luminance control signal $V_{con}$ for controlling the lighting unit 900 or changing a gamma value for image signal correction.

The inverter 920 drives the lamp unit 910 in response to a lighting enable signal EN from an external device or the signal controller 600, and the luminance control signal $V_{con}$ from the voltage converter 60. However, the sensor output voltage $V_{out}$ may be used as an input to control the inverter 920 depending on a characteristic of the inverter 920, and, in such a case, the voltage converter 60 may be omitted.

Referring now to FIG. 6, the LCD also includes a display module 350 having a display unit 330 and a backlight unit 340, a front chassis 361, a rear chassis 362 and a mold frame 364 containing and fixing the display module 350. The display unit 330 includes a display panel assembly 300, an integration chip 610 and an FPC film 620. Capacitors C2 and C4 may be provided interior to the integration chip 610 or provided on exposed areas P1. In this way, capacitances of the capacitors C2 and C4 are increased to reduce sensitivity of the sensor output voltage $V_{out}$ to noise. The FPC film 620 may include signal lines transmitting signals and voltages to be supplied to the integration chip 620 and the panel assembly 300.

The panel assembly 300 is divided into a display area P2 and a peripheral area P3. The photosensor 50 may be integrated into the panel assembly 300 and the sensor 51 and the reference voltage generator 52 of the photosensor 50 may be disposed in either the display area P2 or the peripheral areas P3. As described above, the sensor transistors Q1 and Q4 are preferably arranged adjacent to each other such that variation for current characteristics of each of the sensor transistors Q1 and Q4 is the same.

The integration chip 610 is a single chip also called one-chip and may include the gray voltage generator 800, the data driver 500, the photosensor 50, the voltage converter 60, and the signal controller 600 shown in FIG. 5. The one-chip reduces both an area occupied by the above-mentioned elements and a power consumption of the above-mentioned elements.

The backlight unit 340 includes the lamps disposed behind the display panel assembly 300, the light guiding plate 342 and optical sheets 343 that are disposed between the panel assembly 300 and the lamps to guide and diffuse light from the lamps to the panel assembly 300, and the reflector 344 disposed under the lamps and reflecting light from the lamps toward the panel assembly 300.

Now, the operation of the LCD shown in FIGS. 5 and 6 will be described in detail.

Figure 8:
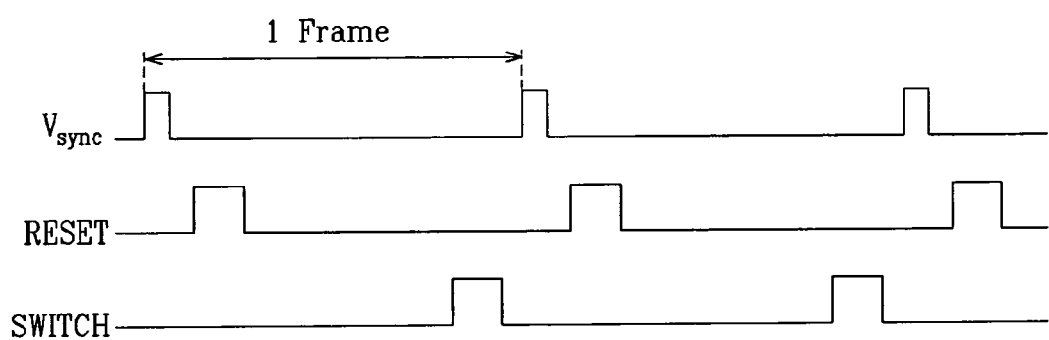
FIG. 8 is an exemplary timing chart of a reset signal and a switching signal for the photosensor shown in FIG. 2.

FIG. 8 is an exemplary timing chart of a reset signal RESET and a switching signal SWITCH for the photosensor 50 shown in FIG. 2.

The signal controller 600 is supplied with input image signals R, G and B and input control signals controlling display of the image signals R, G and B such as a vertical synchronization signal Vsync, a horizontal synchronization signal Hsync, a main clock MCLK, and a data enable signal DE, from an external graphics controller (not shown). After generating gate control signals CONT1, data control signals CONT2, the reset signal RESET and the switching signal SWITCH and processing the image signals R, G and B suitable for operation of the panel assembly 300 responsive to the input control signals and the input image signals R, G and B, the signal controller 600 provides the gate control signals CONT1 to the gate driver 400, and the processed image signals DAT and the data control signals CONT2 to the data driver 500, and the reset signal RESET and the switching signal SWITCH to the photosensor 50.

The gate control signals CONT1 include a scanning start signal for initiating scanning and a clock signal for controlling the output time of the gate-on voltage $V_{on}$. The gate control signals CONT1 may further include an output enable signal for defining the duration of the gate-on voltage $V_{on}$.

The data control signals CONT2 include a horizontal synchronization start signal for informing the data driver 500 of a start of data transmission to pixels, a load signal for instructing the data driver 500 to apply the data voltages to the data lines $D_1$-$D_m$, and a data clock signal. The data control signal CONT2 may further include an inversion signal for reversing a polarity of the data voltages (with respect to the common voltage Vcom).

As shown in FIG. 8, the reset signal RESET and the switching signal SWITCH have a period of one frame. The signal controller 600 may generate a separate reset signal RESET. Alternatively, for example, one of signals having a period of one frame such as the vertical synchronization start signal, a frame head pulse, the vertical synchronization signal Vsync may be used as the reset signal RESET. In addition, the signal controller 600 may use one of gate signals applied to the gate lines G1-Gn as the switching signal SWITCH. In this way, signals used for the LCD can be used to provide the reset signal RESET and the switching signal SWITCH without requiring separate signals. The reset signal RESET and the switching signal SWITCH may have a period of one frame, several frames or dozens of frames.

Responsive to the data control signals CONT2 from the signal controller 600, the data driver 500 receives a packet of the image data DAT for a group of pixels from the signal controller 600, converts the image data DAT into analog data voltages selected from the gray voltages supplied from the gray voltage generator 800, and applies the data voltages to the data lines $D_1$-$D_m$.

The gate driver 400 applies the gate-on voltage $V_{on}$ to the gate line $G_1$-$G_n$ in response to the gate control signals CONT1 from the signal controller 600, thereby turning on the switching elements Q connected thereto. The data voltages applied to the data lines $D_1$-$D_m$ are supplied to the pixels through the activated switching elements Q.

a difference between a data voltage and the common voltage Vcom applied to a pixel is expressed as a charged voltage of the LC capacitor $C_{LC}$, i.e., a pixel voltage. Liquid crystal molecules have orientations depending on a magnitude of the pixel voltage.

By repeating this procedure by a unit of the horizontal period (which is denoted by "1H" and equal to one period of the horizontal synchronization signal Hsync and the data enable signal DE), all gate lines $G_1$-$G_n$ are sequentially supplied with the gate-on voltage $V_{on}$ during a frame, thereby applying the data voltages to all pixels. When a next frame starts after finishing one frame, the inversion control signal applied to the data driver 500 is controlled such that a polarity of the data voltages is reversed (which is referred to as "frame inversion"). The inversion control signal may also be controlled such that the polarity of the data voltages flowing in a data line in one frame are reversed (for example, line inversion and dot inversion), or such that the polarity of the data voltages in one packet are reversed (for example, column inversion and dot inversion).

Additionally, the photosensor 50 resets the capacitors C1 and C3 responsive to the reset signal RESET. In other words, when the reset signal RESET is at a high level, the photosensor 50 discharges the charges stored in the capacitors C1 and C3, and when the reset signal RESET is at a low level, the photosensor 50 stores corresponding charges in the capacitors C1 and C3 to generate the first and second photovoltages $V_{p1}$ and $V_{p2}$ and the photo and reference currents $I_{off}$ and $I_{ref}$.

After a predetermined time elapses, the charges stored in the capacitors C1 and C3 are transmitted to the capacitors C2 and C4, respectively, to charge the capacitors C2 and C4 identical to the charges stored in the capacitor C1 and C3. The processor 55 of the photosensor 50 calculates the difference between the sensing voltage $V_{sen}$ and the reference voltage $V_{ref}$ charged in the capacitors C2 and C4 to generate the sensor output voltage $V_{out}$.

The voltage converter 60 converts the sensor output voltage $V_{out}$ from the photosensor 50 into the luminance control voltage $V_{con}$ for transmittance to the inverter 920 and the signal controller 600. The inverter 920 controls the luminance of the lamps responsive to the luminance control voltage $V_{con}$ and the signal controller 600 changes the gamma value for image correction responsive to the luminance control voltage $V_{con}$.

The voltage converter 60 will now be described in detail with reference to FIGS. 9A to 11C.

Figure 9A:
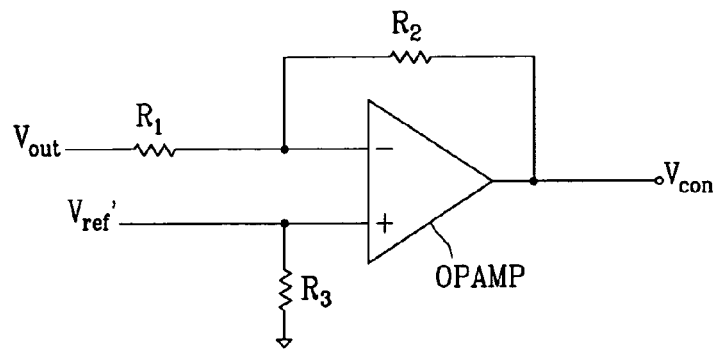
FIG. 9A is an exemplary circuit diagram of a voltage converter according to an exemplary embodiment of the present invention.
Figure 9B:
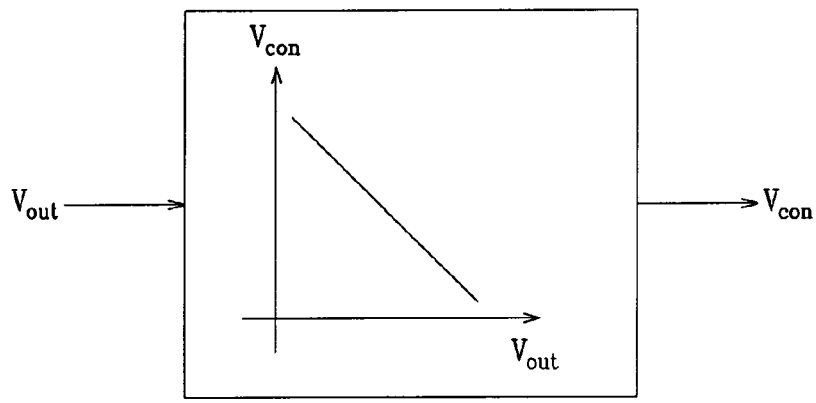
FIG. 9B is a graph to illustrate input-output voltage characteristic of the converter shown in FIG. 9A.

FIG. 9A is an exemplary circuit diagram of a voltage converter according to an exemplary embodiment of the present invention and FIG. 9B is a graph illustrating an input-output voltage characteristic of the voltage converter 60 shown in FIG. 9A.

The voltage converter 60 shown in FIG. 9A converts the sensor output voltage $V_{out}$ from the photosensor 50 into a luminance control signal $V_{con}$. The voltage converter 60 includes an operational amplifier OPAMP having a first input resistor R1, a second input resistor R3 and a feedback resistor R2. The operational amplifier OPAMP serves as an inverting amplifier. The amplifier OPAMP has an inverting terminal (−) and a non-inverting terminal (+). The inverting terminal (−) receives the sensor output voltage $V_{out}$ via the first input resistor R1 and the non-inverting terminal (+) receives a reference voltage $V_{ref}'$. The non-inverting terminal (+) is electrically connected to the second input resistor R3, which is disposed between the non-inverting terminal (+) and ground.

The luminance control signal $V_{con}$ is generated in response to the sensor output voltage $V_{out}$ and the reference voltage $V_{ref}'$ based on the expression below:

$$V_{con} = R1/R2 \cdot (V_{ref}' - V_{out}) + V_{ref}' \quad (2)$$

which is illustrated in FIG. 9B.

Referring to FIG. 9B, the luminance control signal $V_{con}$ is a linear function of the sensor output voltage $V_{out}$ and has a negative gradient such that the luminance control signal $V_{con}$ decreases as the sensor output voltage $V_{out}$ increases. When the sensor output voltage $V_{out}$ is high, which indicates that the amount of the received light is large, the luminance control signal $V_{con}$ is adjusted to reduce a luminance of the lamp unit 910. On the contrary, when the sensor output voltage $V_{out}$ is low, the luminance control signal $V_{con}$ is adjusted to increase the luminance of the lamp unit 910.

Figure 10A:
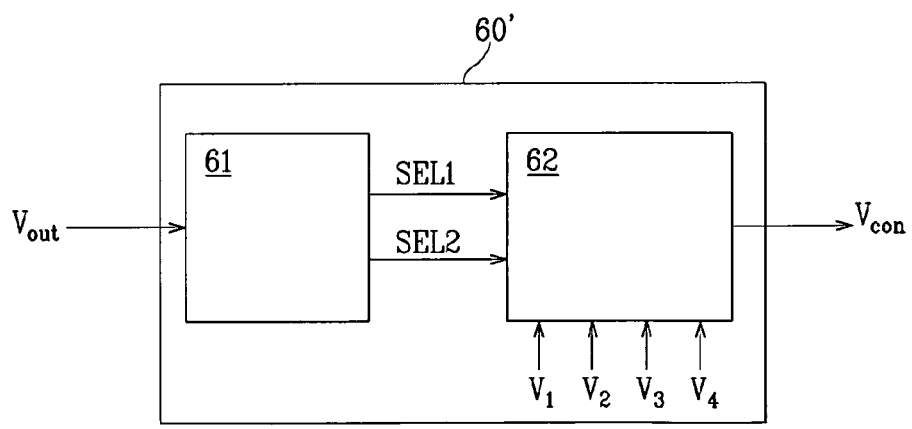
FIG. 10A is an exemplary block diagram of a voltage converter according to another exemplary embodiment of the present invention.
Figures 10B, 10C:
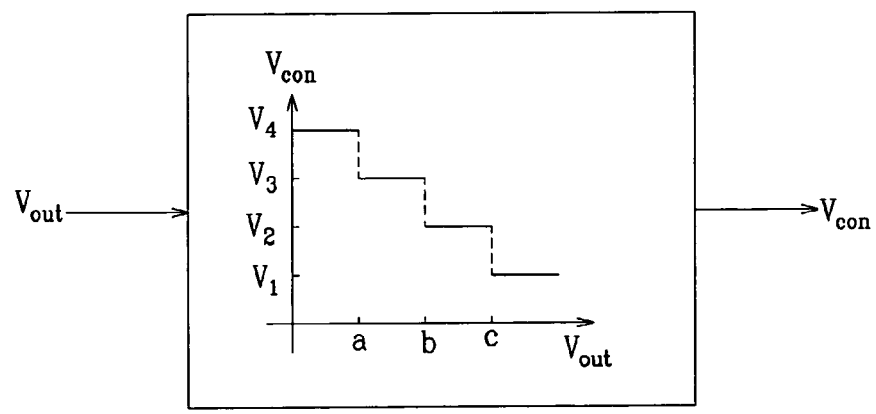
FIG. 10B is a table to illustrate an input-output relationship of the voltage converter shown in FIG. 10A.
FIG. 10C illustrates input-output characteristics of the voltage converter shown in FIG. 10A.

FIG. 10A is an exemplary block diagram of a voltage converter 60' according to another exemplary embodiment of the present invention and FIG. 10B is a table illustrating an input-output relationship of the voltage converter shown in FIG. 10A. FIG. 10C illustrates an input-output characteristic of the voltage converter 60' shown in FIG. 10A.

Referring now to FIGS. 10A to 10C, the voltage converter 60' includes a 2-bit analog-to-digital (AD) converter 61 and a four-channel multiplexer 62. The AD converter 61 receives a sensor output voltage $V_{out}$ and divides the magnitude of the sensor output voltage $V_{out}$ into four levels to generate a 2-bit selection signal SEL1 and SEL2. The multiplexer 62 outputs one of four voltages V1-V4 based on the selection signal SEL1 and SEL2. As shown in FIGS. 10B and 10C, parameters a, b and c and the voltages V1-V4 are set so that the luminance control signal $V_{con}$ decreases as the sensor output voltage $V_{out}$ increases.

A number of values of the luminance control signal $V_{con}$ may be increased by increasing a bit number of an output of the AD converter 61 and increasing a number of channels of the multiplexer 62. Alternatively, the number of values of the luminance control signal $V_{con}$ may be decreased.

Figure 11A:
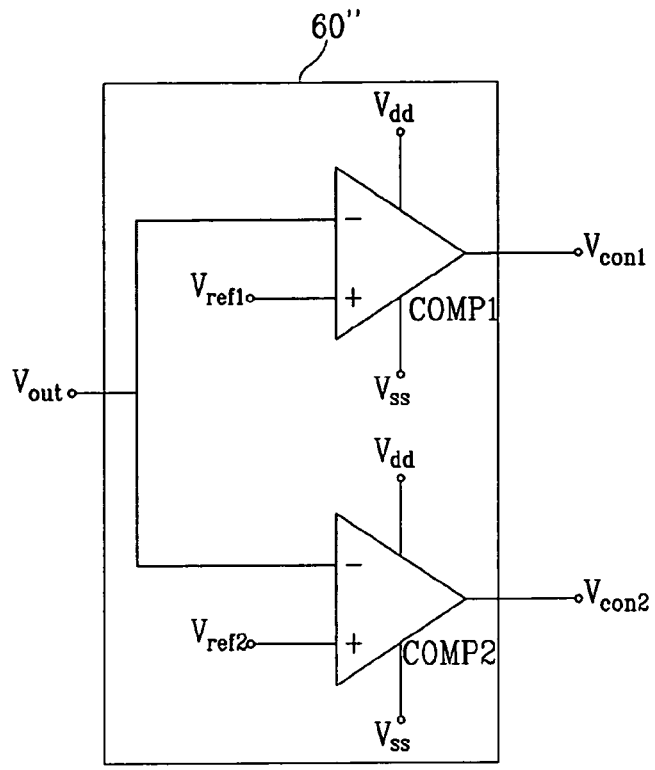
FIG. 11A is an exemplary block diagram of a voltage converter according to another exemplary embodiment of the present invention.
Figure 11B:
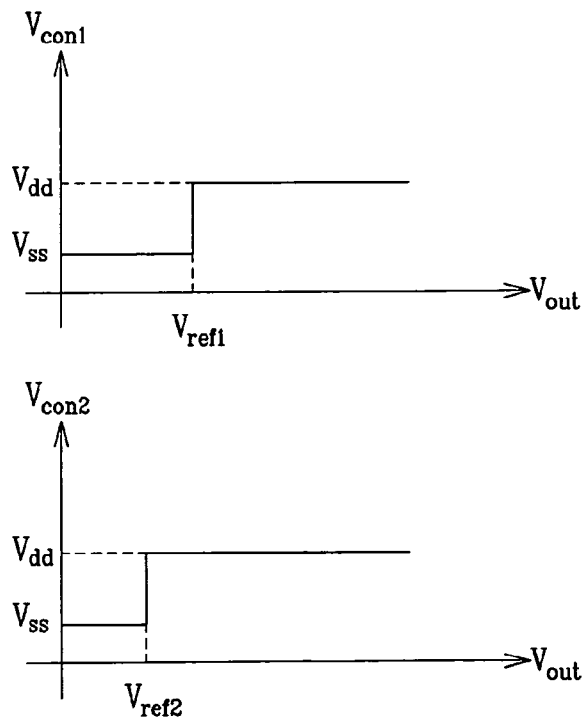
FIG. 11B is a graph to illustrate a relationship between input-output voltages of the voltage converter shown in FIG. 11A.
Figure 11C:
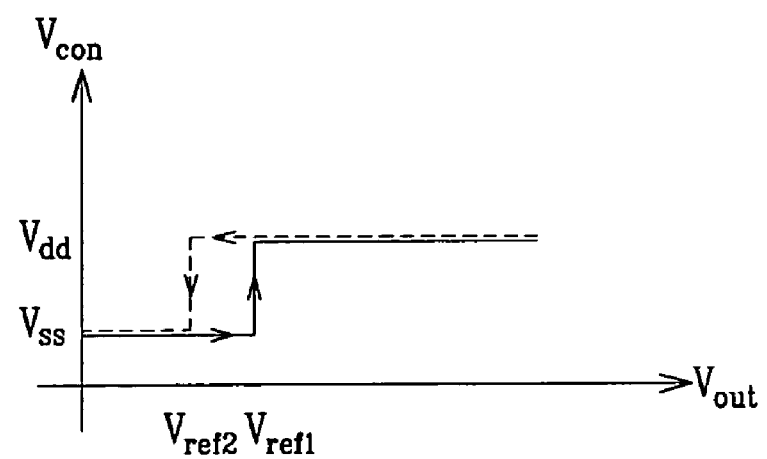
FIG. 11C is a graph to illustrate a hysteresis characteristic of a luminance control voltage of the voltage converter shown in FIG. 11A.

FIG. 11A is an exemplary block diagram of a voltage converter 60" according to another exemplary embodiment of the present invention. FIG. 11B is a graph to illustrate a relationship between corresponding input-output voltages of the voltage converter 60" shown in FIG. 11A. FIG. 11C is a graph to illustrate a hysteresis characteristic of a luminance control voltage of the voltage converter 60" shown in FIG. 11A.

Referring to FIG. 11A, the voltage converter 60" includes two comparators COMP1 and COMP2. Each comparator COMP1 and COMP2 receives the sensor output voltage $V_{out}$ through a corresponding inverting terminal of each of the comparators COMP1 and COMP2. Each comparator COMP1 and COMP2 receives comparison voltages Vref1 and Vref2 through a corresponding non-inverting terminal of each of the comparators COMP1 and COMP2. The voltage converter 60" outputs a first voltage Vdd for a high sensor output voltage $V_{out}$ relative to the comparison voltages Vref1 and Vref2 and outputs a second voltage Vss for a low sensor output voltage $V_{out}$ relative to the comparison voltages Vref1 and Vref2.

The signal controller 600 controls power to the lamps in response to a first luminance control signal Vcon1 and a second luminance control signal Vcon2 output from the voltage converter 60" or changes the gamma values for image correction. The first and second luminance control signals Vcon1 and Vcon2 have hysteresis characteristics as shown in FIG. 11C, thereby preventing frequent turning on/off of the lamps and frequent changes of the gamma value.

The photosensor 50 as described above may be employed for other display devices such as OLED or PDP.

Now, a structure of the photosensor will be described with reference to FIGS. 12 and 13.

Figure 12:
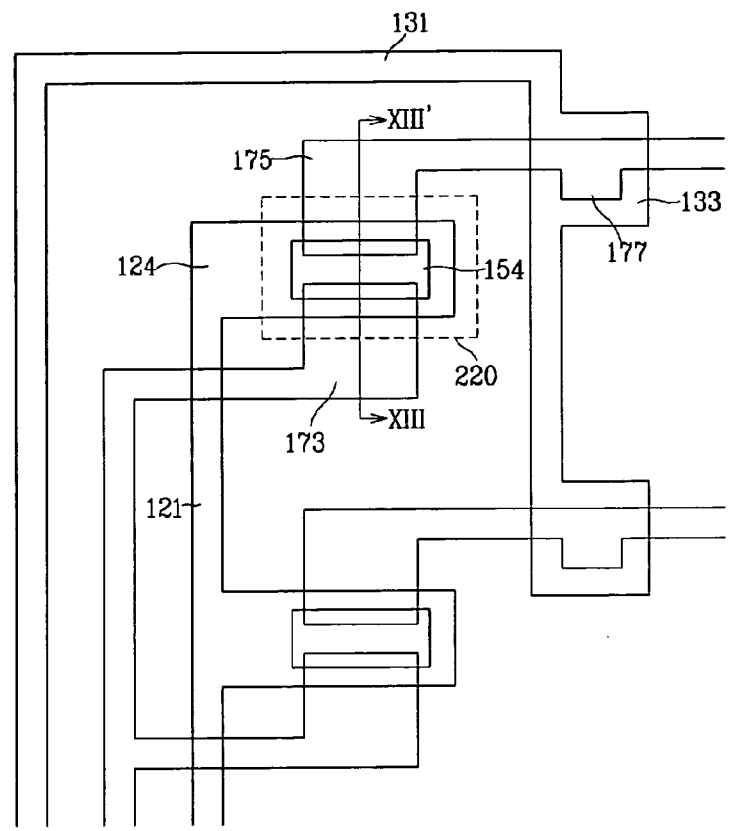
FIG. 12 is a layout view of the sensor transistors in the photosensor shown in FIG. 2.

FIG. 12 is a layout view of the sensor transistors Q1 and Q4 in the photosensor 50 shown in FIG. 2. FIG. 13 is a sectional view of the sensor transistors Q1 and Q4 taken along line XIII-XIII' in FIG. 12.

Figure 13:
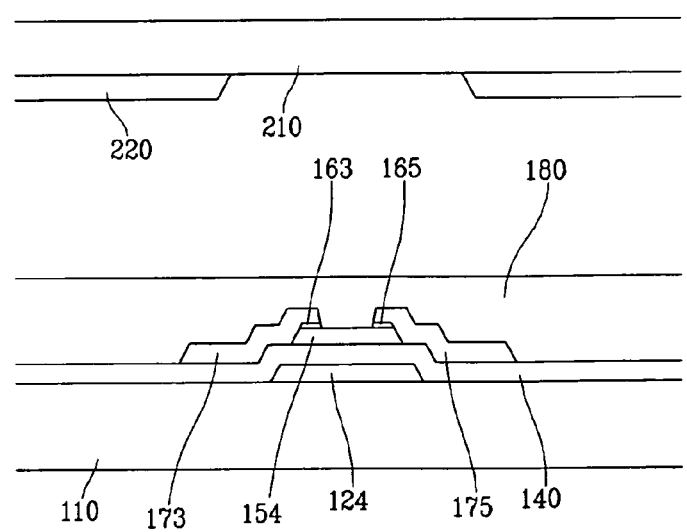
FIG. 13 is a sectional view of one of the sensor transistors of FIG. 12 taken along line XIII-XIII'.

Referring to FIGS. 2, 12 and 13, a gate line 121 including a gate electrode 124 receives the voltage $V_{DD}$ and is formed on an insulating substrate 110. A gate insulating layer 140 preferably made of silicon nitride (SiNx) is formed on the gate line 121. A semiconductor island 154 preferably made of hydrogenated amorphous silicon (a-Si) is disposed on the gate insulating layer 140. A pair of ohmic contacts 163 and 165 are disposed on the semiconductor islands 154. The ohmic contacts 163 and 165 preferably include silicide or hydrogenated a-Si heavily doped with n type impurity, and the ohmic contacts 163 and 165 are disposed as a pair separated across the gate electrode 124. Lateral sides of the semiconductor island 154 and the ohmic contacts 163 and 165 are inclined relative to a surface of the insulating substrate 110, and the inclination angles thereof preferably range from about 30 degrees to about 80 degrees.

A source electrode 173 and a drain electrode 175 separated from the source electrode 173 and capacitor conductors 177 for the capacitor C1 or C3 are formed on the ohmic contacts 163 and 165 and the gate insulating layer 140. The source electrode 173 receives the voltage $V_{DD}$ and the drain electrode 175 outputs either the photocurrent Ioff or the reference current Iref.

Each pair of source and drain electrodes 173 and 175 are disposed opposite each other with respect to the gate electrode 124. The gate electrode 124, the source electrode 173, and the drain electrode 175 along with the semiconductor island 154 form a TFT having a channel formed in the semiconductor island 154 disposed between the source electrode 173 and the drain electrode 175.

Like the gate lines 121, the source electrode 173, the drain electrodes 175 and the capacitor conductors 177 have lateral sides that are inclined having inclination angles that range from about 30 degrees to about 80 degrees.

A passivation layer 180 is formed on the source electrodes 173 and the drain electrodes 175, and exposed portions of the semiconductor island 154. The passivation layer 180 is preferably made of an inorganic insulator such as silicon nitride or silicon oxide, a photosensitive organic material having a good flatness characteristic, or a low dielectric insulating material having a dielectric constant lower than 4.0 such as a-Si:C:O and a-Si:O:F formed by plasma enhanced chemical vapor deposition (PECVD).

Lines extending from the drain electrodes 175 overlap capacitor electrodes 133 to form the capacitor C1 or C3. The capacitor electrodes 133 are applied with a ground voltage via a capacitor electrode line 131.

Light blocking layers 220 are formed on an insulating substrate 210 on an upper panel 200 facing the lower panel 100. The light blocking layers 220 have openings having boundaries expressed as dotted lines to expose, for example, the sensing transistor Q1 to external light as shown in FIG. 12.

In this way, the sensing voltage $V_{sen}$ corresponding to the amount of received external light and the reference voltage $V_{ref}$ in a light blocked state are generated to provide a difference voltage as the sensor output voltage $V_{out}$, thereby outputting a stable value of the photosensor 50 regardless of sensitivity variation of the photosensor 50 and corresponding to the amount of received external light.

Thus, luminance of the lighting unit 900 is controlled in response to the sensor output voltage $V_{out}$, which corresponds to the amount of external light received and the gamma values for image signal correction are accurately changed by employing the photosensor 50.

While the present invention has been described in detail with reference to the preferred embodiments, it is to be understood that the invention is not limited to the disclosed embodiments, but, on the contrary, is intended to cover various modifications and equivalent arrangements included within the sprit and scope of the appended claims.

What is claimed is:

1. A photosensor comprising:
   a sensor receiving an external light and generating a sensing voltage in response to an amount of the external light received, the sensor comprising a first light receiver generating a first photovoltage in response to the amount of the external light received, and a first output unit converting the first photovoltage into the sensing voltage;
   a reference voltage generator blocked from the external light and generating a reference voltage, the reference voltage generator comprising a second light receiver generating a second photovoltage, and a second output unit converting the second photovoltage into the reference voltage; and
   a processor receiving the sensing voltage from the sensor and the reference voltage from the reference voltage generator to generate a sensor output voltage in response to a difference between the sensing voltage and the reference voltage,
   wherein the first output unit comprises a first switching transistor selectively outputting the first photovoltage responsive to a switching signal, and the second output unit comprises a second switching transistor selectively outputting the second photovoltage responsive to the switching signal.

2. The photosensor of claim 1, wherein the first light receiver comprises:
   a first sensor transistor exposed to the external light and generating a photocurrent in response to the amount of the external light received; and
   a first capacitor storing charges in response to the photocurrent to generate the first photovoltage, and
   the second light receiver comprises:
   a second sensor transistor generating a reference current; and
   a second capacitor storing charges in response to the reference current to generate the second photovoltage.

3. The photosensor of claim 2, further comprising a light blocking member blocking the second sensor transistor from the external light.

4. The photosensor of claim 3, wherein the first sensor transistor includes an input terminal receiving a first voltage, a control terminal receptive of an off voltage for turning off the first sensor transistor, an output terminal outputting the photocurrent, and a first photosensitive layer connected between the input terminal and the output terminal and generating the photocurrent, and
   the second sensor transistor includes an input terminal receiving the first voltage, a control terminal receptive of the off voltage, an output terminal outputting the reference current, and a second photosensitive layer generating the reference current.

5. The photosensor of claim 4, wherein the first and second photosensitive layers are made of a same material.

6. The photosensor of claim 5, wherein the first and second photosensitive layers are made of amorphous silicon.

7. The photosensor of claim 4, wherein the first capacitor includes a first terminal connected to the output terminal of the first sensor transistor and a second terminal receiving a second voltage, and the second capacitor includes a first terminal connected to the output terminal of the second sensor transistor and a second terminal receiving the second voltage.

8. The photosensor of claim 7, wherein the second voltage is a ground voltage.

9. The photosensor of claim 1, wherein the first switching transistor includes a control terminal receptive of the switching signal, an input terminal receiving the first photovoltage, and an output terminal selectively outputting the first photovoltage responsive to the switching signal, and
   the second switching transistor includes a control terminal receptive of the switching signal, an input terminal receiving the second photovoltage, and an output terminal selectively outputting the second photovoltage responsive to the switching signal.

10. The photosensor of claim 9, wherein the first output unit further comprises a first output capacitor converting an output of the first switching transistor into the sensing voltage, and the second output unit further comprises a second output capacitor converting an output of the second switching transistor into the reference voltage.

11. The photosensor of claim 10, wherein the first output capacitor includes a first terminal connected to the output terminal of the first switching transistor and a second terminal connected to a second voltage, and the second output capacitor includes a first terminal connected to the output terminal of the second switching transistor and a second terminal connected to the second voltage.

12. The photosensor of claim 11, wherein the second voltage is a ground voltage.

13. The photosensor of claim 1, wherein the sensor further comprises a first reset transistor initializing the first photovoltage in response to a reset signal, and the reference voltage generator further comprises a second reset transistor initializing the second photovoltage in response to the reset signal.

14. The photosensor of claim 13, wherein the first reset transistor includes a control terminal receptive of the reset signal, an input terminal electrically connected to the first photovoltage, and an output terminal for initializing the first photovoltage in response to the reset signal, and the second reset transistor includes a control terminal receptive of the reset signal, an input terminal connected to the second photovoltage, and an output terminal for initializing the second photovoltage in response to the reset signal.

15. The photosensor of claim 1, wherein the processor comprises a first operational amplifier inverting the sensing voltage to produce an inverted sensing voltage; and a second operational amplifier adding the inverted sensing voltage to the reference voltage for inversion.

16. A display device comprising:
a photosensor receiving an external light to generate a sensor output voltage corresponding to an amount of the external light received;
a voltage converter converting the sensor output voltage into a control voltage;
a panel assembly including pixels; and
a lighting unit having a luminance provided to the pixels responsive to the control voltage,
wherein the photosensor comprises:
a sensor generating a sensing voltage corresponding to the amount of the external light received, the sensor comprising a first light receiver generating a first photovoltage in response to the amount of the external light received, and a first output unit converting the first photovoltage into the sensing voltage;
a reference voltage generator blocked from the external light and generating a reference voltage, the reference voltage generator comprising a second light receiver generating a second photovoltage, and a second output unit converting the second photovoltage into the reference voltage; and
a processor generating the sensor output voltage which is a difference between the sensing voltage and the reference voltage,
wherein the first output unit comprises a first switching transistor selectively outputting the first photovoltage responsive to a switching signal, and the second output unit comprises a second switching transistor selectively outputting the second photovoltage responsive to the switching signal.

17. The display device of claim 16, further comprising a signal controller which generates a switching signal and a reset signal.

18. The display device of claim 16, wherein the first light receiver comprises:
a first sensor transistor exposed to the external light and generating a photocurrent in response to the amount of the received light; and
a first capacitor storing charges in response to the photocurrent to generate the first photovoltage, and
the second light receiver comprises:
a second sensor transistor generating a reference current; and
a second capacitor storing charges in response to the reference current to generate the second photovoltage.

19. The display device of claim 18, wherein the photosensor further comprises a light blocking member blocking the second sensor transistor from the external light.

20. The display device of claim 19, wherein the first sensor transistor comprises a first photosensitive layer generating the photocurrent, and the second sensor transistor comprises a second photosensitive layer generating the reference current, and the first and second photosensitive layers are made of amorphous silicon.

21. The display device of claim 20, wherein the first and second sensor transistors are arranged adjacent to each other in the panel assembly.

22. The display device of claim 16, wherein the first output unit further comprises a first output capacitor converting an output of the first switching transistor into the sensing voltage, and the second output unit further comprises a second output capacitor converting an output of the second switching transistor into the reference voltage.

23. The display device of claim 16, wherein the sensor further comprises a first reset transistor initializing the first photovoltage responsive to a reset signal, and the reference voltage generator further comprises a second reset transistor initializing the second photovoltage responsive to the reset signal.

24. The display device of claim 16, wherein the display device is one of a liquid crystal display, an organic electroluminescent display and a plasma display panel.

* * * * *